(12) United States Patent
Rossum et al.

(10) Patent No.: US 8,965,942 B1
(45) Date of Patent: Feb. 24, 2015

(54) SYSTEMS AND METHODS FOR SAMPLE RATE TRACKING

(71) Applicants: David P. Rossum, Santa Cruz, CA (US);
Sneha Date, Sunnyvale, CA (US);
Xiaojun Chen, Longmont, CO (US)

(72) Inventors: David P. Rossum, Santa Cruz, CA (US);
Sneha Date, Sunnyvale, CA (US);
Xiaojun Chen, Longmont, CO (US)

(73) Assignee: Audience, Inc., Mountain View, CA (US)

( * ) Notice: Subject to any disclaimer, the term of this patent is extended or adjusted under 35 U.S.C. 154(b) by 0 days.

(21) Appl. No.: 14/207,096

(22) Filed: Mar. 12, 2014

Related U.S. Application Data

(60) Provisional application No. 61/785,370, filed on Mar. 14, 2013.

(51) Int. Cl.
*G06F 17/17* (2006.01)
*H03K 5/26* (2006.01)

(52) U.S. Cl.
CPC ........................................ *H03K 5/26* (2013.01)
USPC .............................. 708/313; 708/300; 341/61

(58) Field of Classification Search
USPC .............................. 708/290, 300, 313; 341/61
See application file for complete search history.

(56) References Cited

U.S. PATENT DOCUMENTS

| 6,092,126 | A * | 7/2000 | Rossum | 710/52 |
| 6,208,671 | B1 * | 3/2001 | Paulos et al. | 370/545 |
| 6,324,235 | B1 * | 11/2001 | Savell et al. | 375/372 |
| 6,531,970 | B2 * | 3/2003 | McLaughlin et al. | 341/61 |
| 7,330,138 | B2 * | 2/2008 | Mallinson et al. | 341/61 |
| 7,339,503 | B1 * | 3/2008 | Elenes | 341/61 |
| 7,436,333 | B2 * | 10/2008 | Forman et al. | 341/61 |
| 8,405,532 | B1 * | 3/2013 | Clark et al. | 341/61 |
| 8,737,532 | B2 * | 5/2014 | Green et al. | 375/316 |
| 8,804,865 | B2 * | 8/2014 | Elenes et al. | 375/267 |

* cited by examiner

*Primary Examiner* — Patrick O'Neill
(74) *Attorney, Agent, or Firm* — Carr & Ferrell LLP (57) ABSTRACT

Systems and methods for sample rate tracking are provided. An example method includes computing an actual latency associated with an output sample from an output sample stream. The actual latency is calculated using a phase and a phase increment (conversion rate ratio). A measured latency is determined using an internal clock using a presentation time of the output sample, or an input sample from an input sample stream, or both. The measured latency is compared to the actual latency to generate a latency error. A successive phase increment can be determined based on the latency error by using a low-pass or adaptive filter to adjust the latency error.

20 Claims, 8 Drawing Sheets

SYSTEMS AND METHODS FOR SAMPLE RATE TRACKING

CROSS-REFERENCE TO RELATED APPLICATION

The present application claims the benefit of U.S. provisional application No. 61/785,370, filed on Mar. 14, 2013. The subject matter of the aforementioned application is incorporated herein by reference for all purposes.

FIELD

The present application relates generally to audio signal processing and more specifically to sample rate tracking.

BACKGROUND

Audio signals are frequently transmitted in a digital format as a sequence of digital numbers as used in common consumer products such as compact disc players, mobile phones, and the like. Such products typically convert analog audio streams to digital audio data streams for transmission, e.g., over mobile telephone networks.

Two digital audio data streams are often combined to produce a combined input audio data signal. This process of combining multiple audio data streams is commonly called "mixing." In order to mix by adding together two or more input digital audio data streams, the input audio data streams need to have the same sample rate, or the resulting audio will be distorted.

However, in many cases where two or more digital audio data streams are to be mixed, the incoming digital audio data streams do not have the same sample rate. The original sample rate of the audio may have been generated or recorded at different sample rates, such as, for example, 48,000 samples per second for high fidelity audio, and 8,000 samples per second for telephone quality audio.

Even if the original audio sources are generated at the same nominal sample rate, the crystal oscillators commonly used for clocking audio data can cause some error or drift. Typically, lower end crystal oscillators may drift by 1 part in 10,000 or 100 parts per million (PPM).

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

According to an example embodiment, a method for sample rate tracking includes computing an actual latency of an output sample from an output sample stream. The actual latency can be calculated using a phase (phase accumulator) and a phase increment corresponding to the output sample. The phase accumulator includes an index of the output sample in an input sample stream. The phase increment is a conversion sample rate associated with the output sample. The conversion rate can be constant or vary with output samples from the output sample stream. In various embodiments, a phase accumulator corresponding to a current output sample is a sum of conversion rates corresponding to all output samples preceding the current output sample in the output stream.

The method can further include determining a measured latency using, for example, an internal clock. The measured latency can be determined based on a presentation time of the output sample or a presentation time of an input sample from the input sample stream. The method can further include comparing the actual latency to the measured latency to generate a latency error. Successive values of phase increment (conversion sample rate) can be computed based on the latency error filtered with a single low-pass filter feedback loop. In some embodiments, an adaptive filter can be used to filter the latency error. In certain embodiments, the latency error can be determined only for selected output samples.

BRIEF DESCRIPTION OF THE DRAWINGS

Embodiments are illustrated by way of example and not limitation in the figures of the accompanying drawings, in which like references indicate similar elements and in which.

DETAILED DESCRIPTION

Introduction

An Asynchronous Sample Rate Converter (ASRC) can convert an input sample stream X into an output sample stream Y, wherein the sample rates of the input sample stream X and the output sample stream Y can be mutually asynchronous and vary over time. An ASRC typically includes an Asynchronous Sample Rate Tracker (tracker), which can produce a time varying sample rate conversion ratio R, and a resampler, which accepts the input sample stream X and the time varying values of R, and produces output sample stream Y.

Framework

Figure 1:
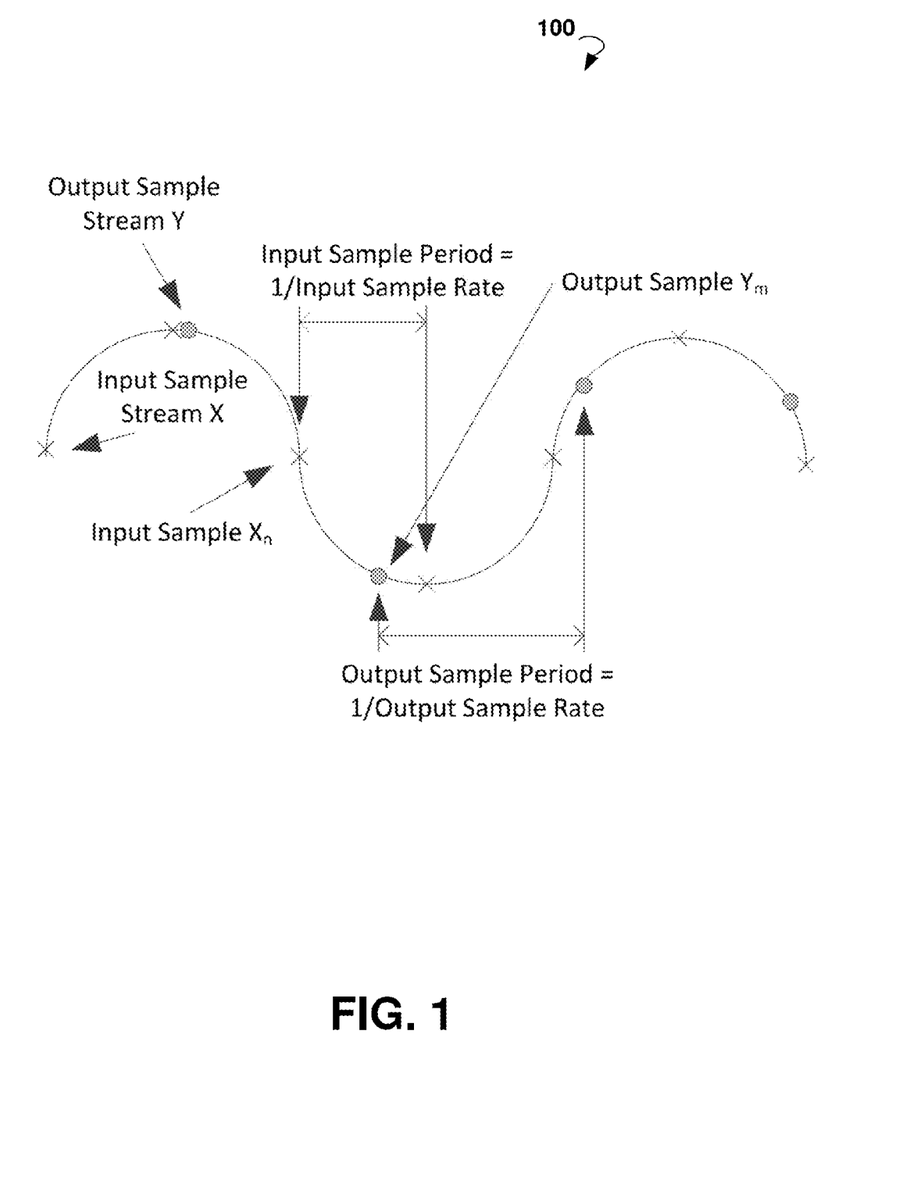
FIG. 1 is a diagram illustrating a relation between an input sample stream, an output sample stream, and a conversion ratio, according to an example embodiment.
Figure 2:
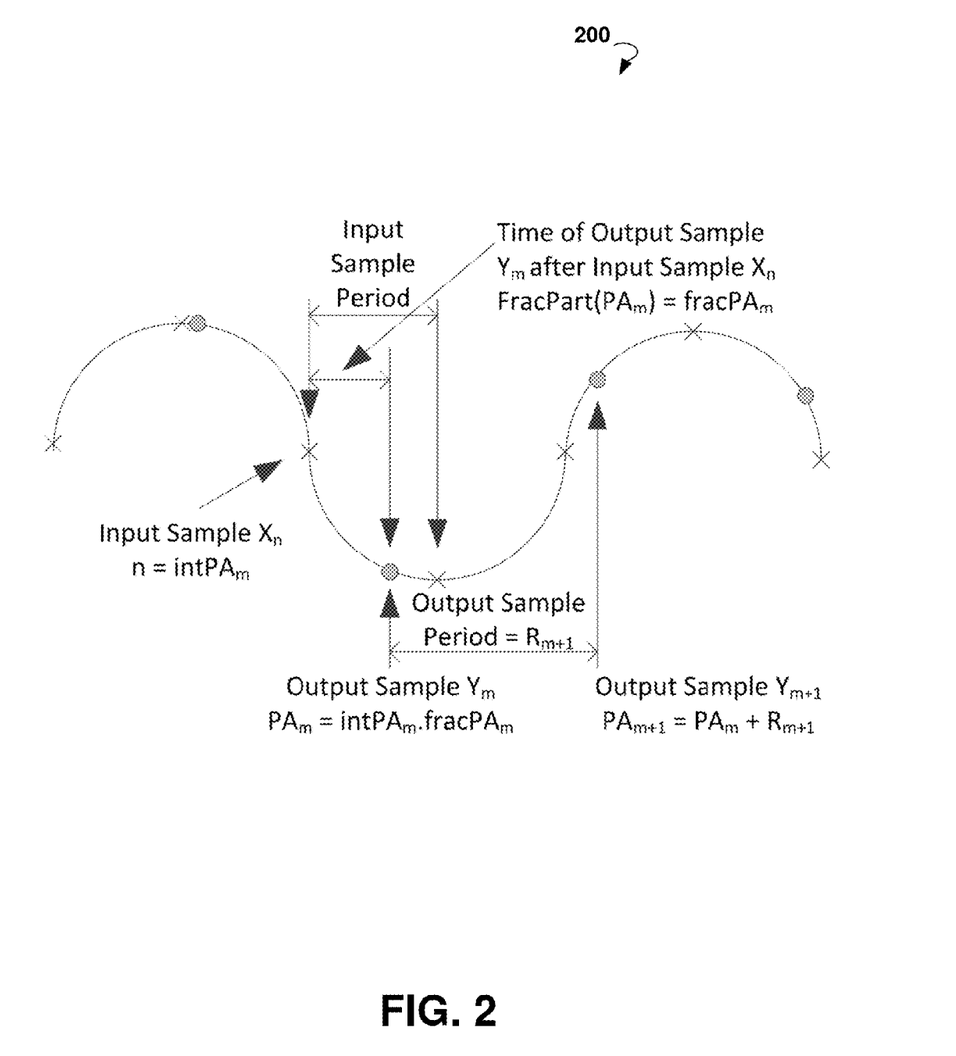
FIG. 2 is a diagram illustrating a phase accumulator as an index of an output sample in an input sample stream, according to an example embodiment.

FIG. 1 shows a diagram 100 illustrating a relation between an input sample stream X, and an output sample stream Y, according to an example embodiment. FIG. 2 is an illustration regarding an ASRC using a time-varying sample rate conversion ratio R with an input sample stream X indexed by n as samples $X_n$ and an output sample stream Y indexed by m as samples $Y_m$. R represents the instantaneous ratio of the input sample rate divided by the output sample rate, therefore, a dimensionless quantity. A value of R=1 corresponds to synchronous streams having the same sample rate, and values R<1 correspond to a conversion producing more output samples than input samples.

FIG. 2 also illustrates a phase accumulator 200 as an index of an output sample stream in an input sample stream, according to an example embodiment. When R varies over time, it comprises a sequence of distinct values. Most resamplers accept, as their input, a sequence of R values corresponding to the output samples ($R_m$ corresponding to $Y_m$). In such implementations, R can also be viewed as a duration measured in input sample periods of the time difference between computed output samples. In such implementations, each $R_m$ can be referred to as a "phase increment," wherein the phase is a dimensionless quantity. This terminology can be useful when the actual use of R in certain resampler implementations is considered. (Note that the technology disclosed herein can be, alternatively, referred to in a different manner, so that each value of R corresponds to an input sample, e.g., $R_n$ corresponding to $X_n$; such reformulation would not change the scope of this disclosure).

Within such resamplers, instantaneous rational values of $R_m$ can be repeatedly added to the "phase accumulator" (PA), once for each output sample. Because $R_m$ is the output sample period, measured in units of input samples, $PA_m$ is thus the index into the input sample sequence $X_n$, representing the location of the present output sample $Y_m$ as a rational number with an integer and a fractional part.

For example, if $R_m$ were 1.5 for all values of m, the initial value $PA_0$ would be 0, and thus the first output sample $Y_0$ would correspond exactly to $X_0$. The next value PAS would be 1.5, and $Y_1$ would correspond to the point halfway between $X_1$ and $X_2$. $PA_2$ would be 3.0, $Y_2$ would correspond to $X_3$, and so forth. (Note, that in the present disclosure it is not necessary for the resampler to use a phase accumulator, only that the resampler can use successive values of $R_m$ to produce corresponding values of $Y_m$. While it can be computationally convenient to use the same phase accumulator for the resampler and the tracker, it can be equally effective for the tracker to maintain its own phase accumulator.)

In some existing systems, the real time values of $R_m$ to be supplied to the resampler can be computed by two processes. In the first process, $R_m$ is initially computed from real-time measurements of the incoming and outgoing sample periods. While this computation can be made with an arbitrarily fine accuracy by averaging multiple period measurements, such computation cannot be exact because it suffers from quantization errors resulting from finite precision arithmetic, and possibly other error sources. As phase accumulator $PA_m$ is computed from the sum of all previous $R_m$ values, these finite errors accumulate.

It is important that the real-time sample streams neither under-run nor over-run. In other words, while a given existing system is able to accommodate a finite error or "slip" in the accumulated rate of input sample consumption with respect to the output sample production, this error must be bounded. Because the index $PA_m$ into the input sample stream for output sample $Y_m$ has an error which, without a further correction, increases unboundedly for increasing m in the existing systems, an ever increasing "slip" is produced. For existing systems, an additional feedback mechanism is required to prevent the slip from growing to the size where finite buffers can no longer accommodate the error.

In the existing systems, a second process typically measures the "slip", typically by determining the fullness of an internal buffer and corrects the $R_m$ values such that when the buffer becomes somewhat full, $R_m$ is adjusted to cause the buffer to become more empty, and vice versa. This is generally performed using a proportional plus integral (PI) feedback process operating based on the buffer fullness.

Any such "slip" corresponds to a variation in the latency of the ASRC. In the existing systems, therefore, the time varying latency over a certain bound is determined by the nature of the PI loop. In contrast, various embodiments of the present disclosure can provide for preventing the accumulation of any such slip, and thus provide a constant, non-time-varying latency.

In some other existing systems, computation of $R_m$ is not based on sample period measurements, but rather on the fullness of a buffer. One of the problems with this approach is that it requires an arithmetic division operation in order to compute the buffer fullness with a sufficient accuracy. Division is known to require more computational resources than addition, subtraction, or multiplication. Furthermore, the approach computes $R_m$ for each value of m, requiring further computational resources.

Existing systems typically utilize hardware buffering for storing samples of the input and output audio streams. In the existing systems, an input ASRC is used to convert input samples at an asynchronous external input rate to the internal signal processing sample rate. Similarly, in the existing systems, an output ASRC is used to convert output samples having an internal signal processing sample rate to an asynchronous external output rate. In such existing systems, the internal signal processing rate remains fixed, while the input and output rates can vary independently and asynchronously with respect to the internal processing rate or with respect to each other.

Typically, in the existing systems, received audio samples are placed in a "ping-pong" style buffer; when one entire half-buffer is full, the half-buffer is flagged for processing by the input ASRC algorithm to place the result in an input "frame buffer" for further processing at the ASRC output sample rate.

Similarly, in the existing systems, outgoing audio samples are transmitted from a ping-pong buffer; when one entire half-buffer is empty, ASRC is performed on queued samples residing in an output frame buffer to fill the channel buffer half-buffer.

Use of multiple samples in the ping-pong buffers for such existing systems allows the ASRC and other methods to be more efficient; however, it creates several problems.

For example, in existing systems, where a PI feedback algorithm is used to prevent excessive slip, the incoming and outgoing rates are asynchronous, so the time when an input ping-pong buffer becomes full is not predictable with respect to the point in time when the corresponding output ping-pong buffer becomes empty. Consequently, the computation of buffer fullness errors by an amount proportional to the ping-pong buffer size which confounds the PI process. Existing systems offer no solution to this problem.

Furthermore, in existing systems, in which $R_m$ must be computed for each new output sample, the buffer fullness must be obtained for each sample. Again, use of ping-pong buffers confounds the process, and thus these existing systems cannot take advantage of the computational efficiency of buffer based processing.

In contrast, various embodiments described in present disclosure are computationally efficient, flexible, and lend themselves readily to buffer based processing.

Overview of Example Embodiments

Various example embodiments described herein can use a value of $PA_m$ associated with a sample $Y_m$ to compute an actual latency (exclusive of any group delay of the resampler signal processing) associated with this sample. The actual latency can be compared to the measured latency based on the presentation time of the input and/or output samples measured from the audio interface. The resulting difference represents a latency error, which is to be substantially reduced or minimized. A single low-pass filter feedback loop computing subsequent values of R based on this error causes the latency to remain nominally constant with an arbitrarily small error, and the value of R to be accurate.

Figure 3:
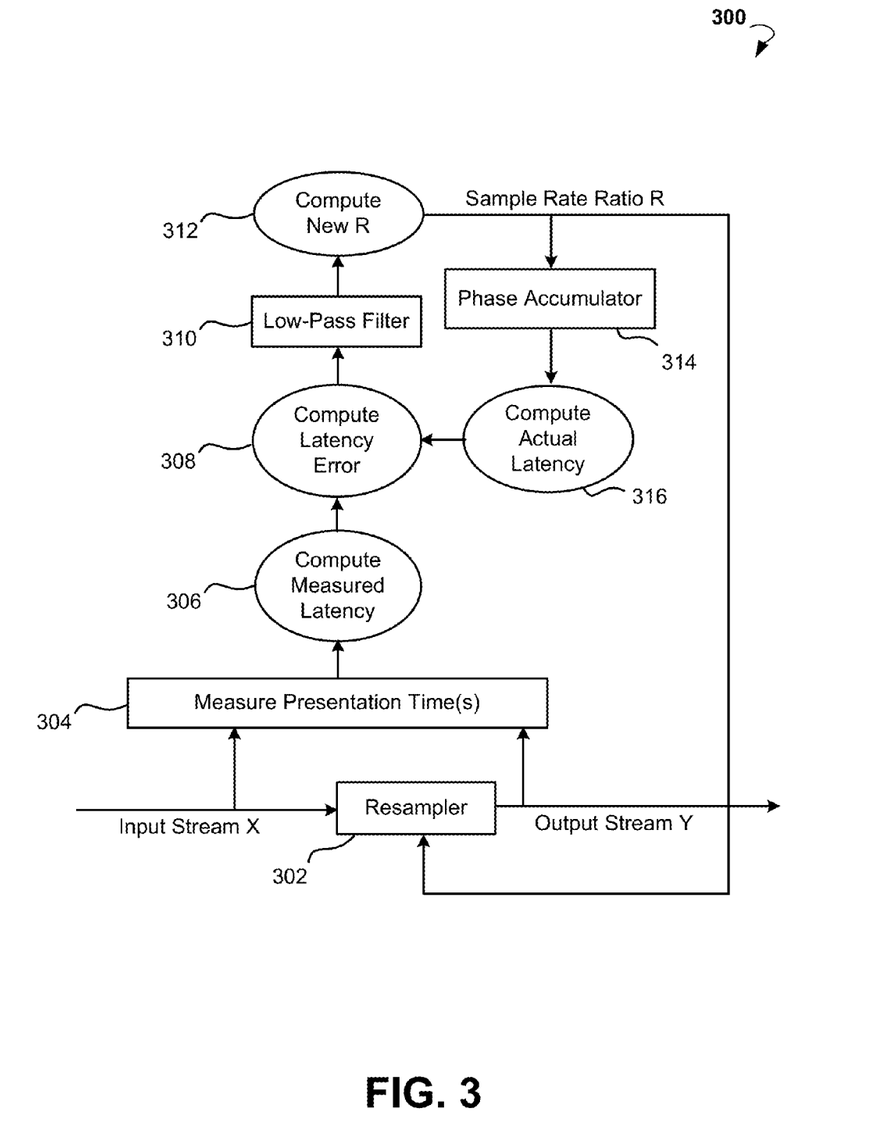
FIG. 3 is a block diagram showing a system for sample rate tracking, according to an example embodiment.

FIG. 3 is a block diagram showing a system 300 for sample rate tracking, according to an example embodiment. The system 300 can include a resampler 302 and operational modules 304-316. The resampler 302 can be operable to receive input (sample) stream X, sample rate ratio R, and generate output (sample) stream Y. The sample rate ratio R is associated with the output stream Y. Operational modules 304-316 can be configured to carry out operations needed for tracking the sample rate. The presentation times associated with sample of the input stream X and/or output stream Y can be calculated by module 304. Based on the presentation times, a measured latency associated with the output stream Y can be computed by module 306. An actual latency associated with the output stream Y can be computed by module 316 using a phase accumulator value associated with the output stream Y. A latency error can be computed by module 308 based on the measured latency and the actual latency. The latency error can be filtered using a low-pass filter by the module 310. A subsequent value of conversion ratio (sequence) R can be evaluated by the module 312 based on the filtered latency error. The subsequent value of the conversion ratio (sequence) R can be provided to resampler 302. The subsequent value of the conversion ratio (sequence) R can also be provided to module 314 to update the phase accumulator associated with the output stream Y.

Producing a Variable and Asynchronous Sample Output Stream from an Input Sample Rate Produced by an Internal Time Base In this example embodiment, it can be assumed that the source sample rate is based on an internal time base, for example, using a chip's crystal oscillator and a processor clock. By way of example and not limitation, a conceptual "wall clock" that counts these clock cycles can be defined. One second is defined for the source samples as an integer number of wall clock cycles and between each sample, were they to be reproduced in real time, there would be an exactly equal integer number of wall clock cycles. While these requirements are not necessary for the technology of present disclosure, they can simplify both the computation and the explanation. k is defined as the number of wall clock cycles between each input sample and the relationship is defined such that k is an integer.

The resampler can convert the input samples to an externally determined and time varying sample rate at which the output transmitter, for example, an I2S digital audio port, operates. A resampler process can accept a sequence of sample rate conversion ratio values $R_m$, each corresponding to an output sample $Y_m$. A phase accumulator value, $PA_m$ is defined for those values corresponding to output samples $Y_m$ and ratios $R_m$ such that $PA_0=0$ and $$PA_m = \Sigma_{j=1}^{m} R_j$$

$R_m$ and $PA_m$ each contain an integer and fractional part. Thus, the phase accumulator $PA_m$ represents, for example, the time measured in input sample periods (each of which is k clock cycles) to which ASRC output sample $Y_m$ corresponds. This time represents the actual latency of the output sample $Y_m$.

For a given output sample, there exists a measurable point in real-time to which the given output sample corresponds. A value of such a time can be established by, for example, determining the value of the wall clock at a specific instant. It should be noted that the strict definition of this time is somewhat arbitrary; consistently adding or subtracting a fixed value may generally not be of consequence. Accordingly, for example, a sample represented by an incoming stream in the I2S audio format can correspond to, for example, the time of the frame sync leading edge for the sample, the time of the next frame sync leading edge, or some time in the middle of the sample's transmission; all of these differ in a fixed value and thus, ultimately, are equivalent for the purposes herein. This measured time can be referred to as the presentation time of the sample and can represent the measured latency of the output sample $Y_m$.

When the time corresponding to the phase accumulator associated with a given output sample is the same as the corresponding real-time measurement of the presentation time, the ASRC is operating at its proper latency so that the sample rate conversion ratio R is correct and no buffer slip can occur. If any difference exists, the difference is applied as an error term to correct subsequent values of R, and any error in the value of R, as well as any slip can be corrected. It should be noted that the operation is analogous to the phase locked loop; essentially, the phase corresponds to the latency, and a phase error is computed, low-pass filtered, and applied to the frequency control input of a variable frequency oscillator, which is analogous to the phase accumulator.

Variable Output Embodiment

Figure 4:
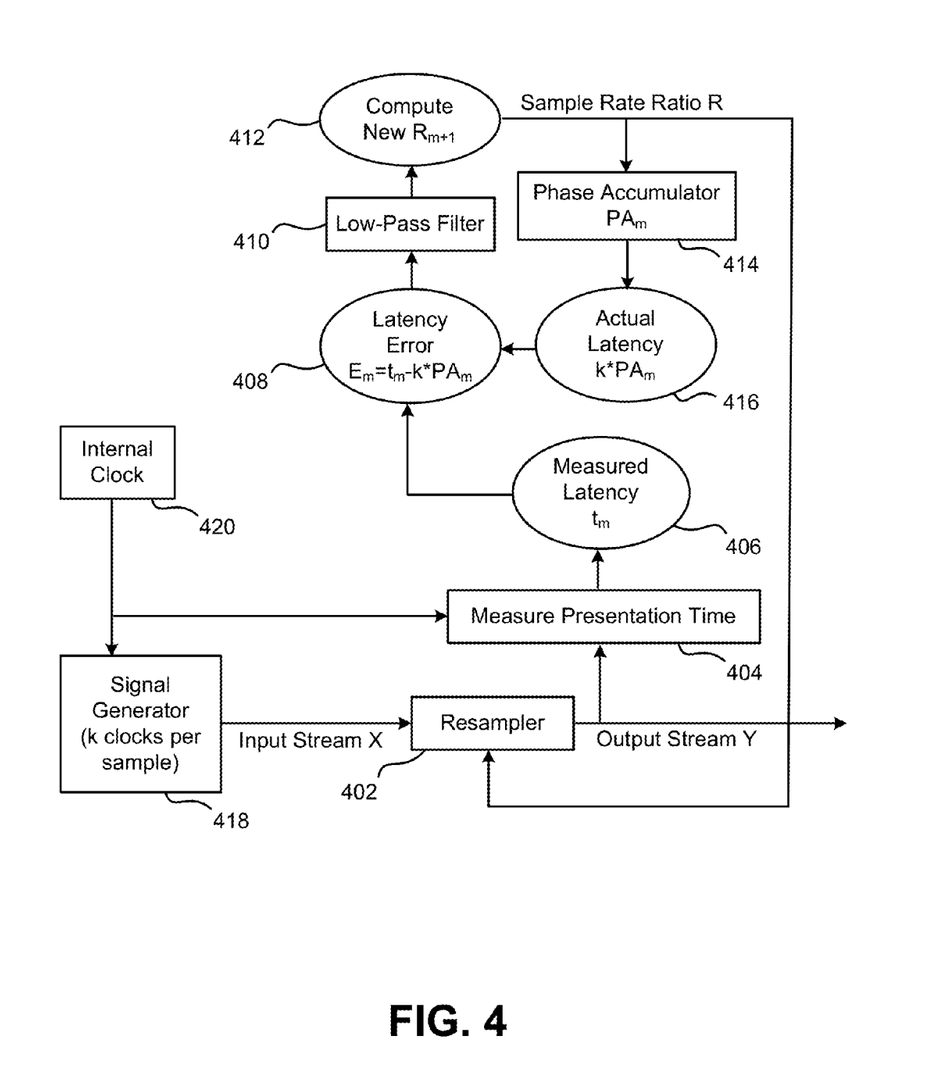
FIG. 4 is a block diagram showing a further system for sample rate tracking, according to an example embodiment.

FIG. 4 is a block diagram showing a system for sample rate tracking 400 with variable output, according to an example embodiment. The input and output sample sequences represent the identical signal. The example system 400 can include a resampler 402, an internal clock 420, a signal generator 418, and operational modules 404-416. The signal generator can produce samples of input stream, one sample per k clicks of the internal clock 420. The resampler 402 can be operable to receive input (sample) stream X, conversion sample rate ratio R, and generate output (sample) stream Y. The sample rate ratio R is associated with the output stream Y. Operational modules 404-416 are operable to carry out operations needed for tracking the sample rate ratio R.

The input sample stream X can include samples $X_n$, where n starts at 0 at time t=0, has a sample period $T_{input}$, and therefore the each input sample $X_n$ represents the signal value at a time $t_n=nT_{input}$. It should be noted that the output sequence Y includes samples $Y_m$, where once again m can start at 0 at time t=0 but have a potentially time varying sample period $T_{out}(m)$. In this case, an output sample $Y_m$ represent the signal at a time:

$$t_m = \Sigma_{j=1}^{m} T_{out}(j)$$

The stream Y can be computed by the ASRC operation from input signal X by computing each value $Y_m$ as a correct signal value at a time corresponding to an internal phase accumulator variable $PA_m$. $PA_m$ can have integer and fractional parts, and can be obtained, for each output sample $Y_m$, by adding the time varying phase increment $R_m$, i.e., $PA_m = PA_{m-1} + R_{m-1}$. It should be noted that $PA_m$ and $R_m$ are both dimensionless, and $R_m$ can represent the ratio of $(T_{out}(m+1)-T_{out}(m))/T_{input}$. $PA_m$ can represent, for the corresponding output point $Y_m$, the time $t_m$ expressed in units of $T_{input}$. In other words, $t_m = PA_m * T_{input}$.

Thus, a latency error equation can be derived as:

$$E_m = t_m - PA_m * T_{input}$$

where error $E_m$ is in units of time and represents a mismatch between the time corresponding to output sample $Y_m$ according to the phase accumulator (based on the sequence of R summed to create $PA_m$, and thus also based on the resampler signal processing) and the time corresponding to sample $Y_m$ based on measured values of the presentation time $T_{out}(m)$. Assuming R is only slowly varying with respect to time, $E_m$ can be used as feedback to correct the value of R.

Similarities to a phase locked loop should be noted. In example embodiments presented herein, there is a "reference" signal input, $T_{out}(m)$, which is a nominally periodic sequence slowly and randomly varying over time, as well as a frequency controlled oscillator $PA_m$. The phases of the two can be compared and a phase difference obtained. The phase difference can be low-pass filtered and, with appropriate gain, fed back to the frequency control input of the oscillator to keep the phases locked.

In some embodiments, aspects of the disclosed technology can be realized using a system wall clock to measure time. All times can be measured in units of wall clock periods. In some embodiments, the input sample period is an integer number of wall clock periods, e.g., $T_{input} = k*T_{clk}$. Similarly, a presentation time $t_m$ can be measured by counting the number of wall clock periods that have occurred since some initial value, such as $t_m = 0$. Thus, the error term $E_m$ can be easily computed by the above equation from readily available values.

The above framework suggests a new latency can be derived for every output sample, producing a new value of $R_m$ for each output sample. While this can be done, it is computationally intensive, and is not needed for a quality result. Alternatively, the latency error $E_m$ can, for example, be computed once for the first sample in each buffer of processed audio. A new value of $R_m$ can be computed from $E_m$; this value can be used for all successive sample rate conversions until the next buffer is accumulated.

To further reduce the computational load, the computation can be performed, in some embodiments, on every other buffer, every third buffer, and so forth. The rate at which the error computation is performed determines the response time of the tracker to variations in the external sample rate; e.g., if the variation is known to be slow, a low computation rate is used.

The above derivation may assume m, $PA_m$ and $t_m$ can grow without bound but this may not be practical in some embodiments. There are, for example, two solutions which allow m to implicitly grow without bound while bounding $PA_m$ and $t_m$.

One solution is to maintain $PA_m$ modulo some integer constant, for example, the size of the buffer, so that its integer part represents the index into that buffer. Correspondingly, $t_m$ may be maintained modulo (for example) k times the size of the buffer, and the subtraction can be performed respecting the modulo nature of these two values, so that $E_m$ will be near zero for all normal operating conditions.

The other solution is to, occasionally (such as, for example, on buffer boundaries), reduce $PA_m$ and $t_m$ (which may otherwise be monotonically increasing) by corresponding amounts to keep $PA_m$ and $t_m$ bounded. If a constant is subtracted from $PA_m$, then k times that constant may be subtracted from $t_m$ without any effect on the error equation.

These two approaches have the same behavior under normal operations but their behavior differs under exceptional circumstances such as, for example, a rapid change in sample rate.

A new value of the conversion ratio $R_m$ can be computed from the error term $E_m$. As mentioned above, this computation can include a low-pass filter with an appropriate error gain. The design of this low-pass filter determines certain performance characteristics of the tracker. The DC gain of the filter can determine the tracking phase error resulting from a change in measured sample rate; ideally this gain is infinite, such that the phase error from any such change is infinitesimal. The cutoff frequency of the filter can determine the jitter rejection of the filter as well as its response time. Jitter in the measured presentation times of the incoming samples that is above the cutoff frequency is proportionally attenuated. Similarly, the tracker may not be able to accurately track changes in the sample rate ratio that occur at a rate higher than the cutoff frequency.

The filter may also be stable and may, preferably, be critically damped. An inadequately damped filter may "ring," producing oscillations in the output value of R in response to a step change in the measured sample rate; an unstable filter may result in unacceptable performance.

Figure 5:
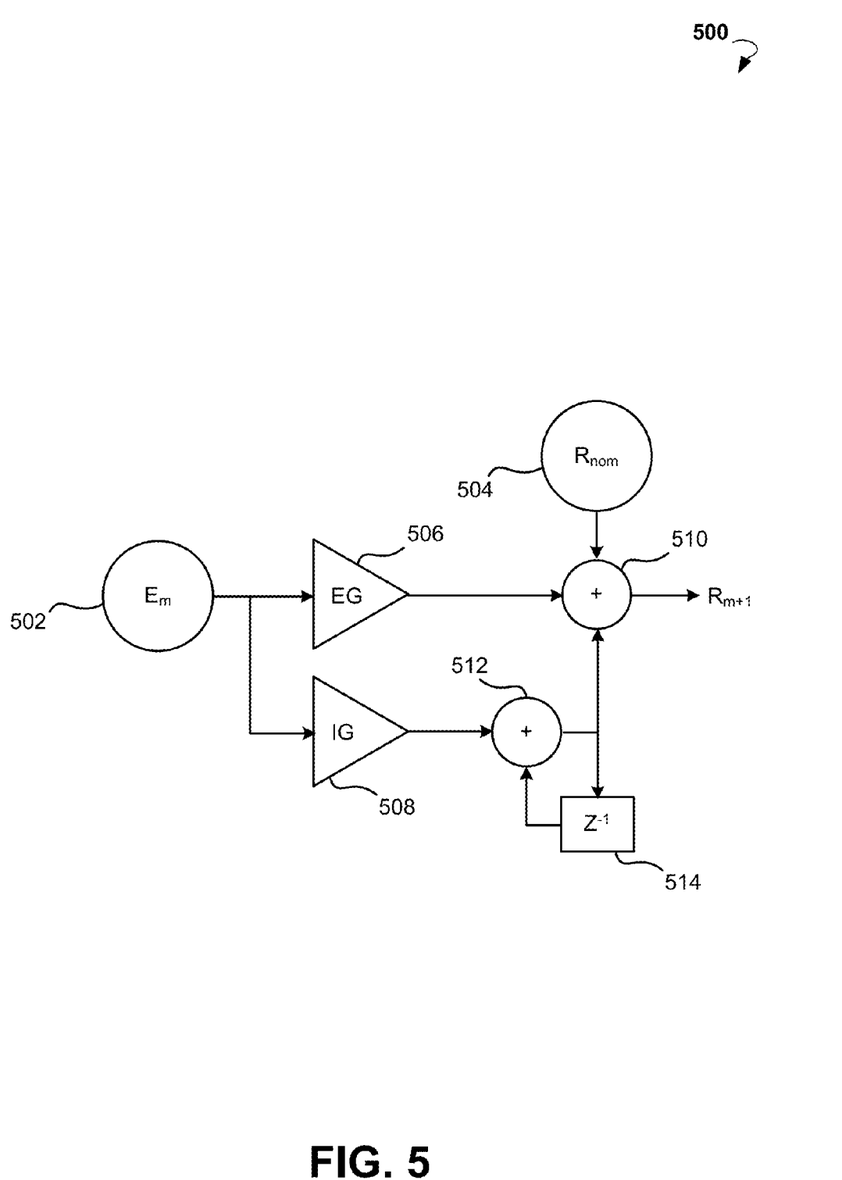
FIG. 5 is block diagram showing a low-pass filter for filtering a latency error, according to an example embodiment.

FIG. 5 is a block diagram showing a low-pass filter 500 for calculating a conversion ratio, according to an example embodiment. The low-pass filter 500 can include operational modules 502-514 operable to filter a latency error. For the filter to be stable, the loop gain may be less than a unity when the phase shift around the loop is 180 degrees. The phase accumulator itself is an integrator, and this provides 90 degrees of phase shift at all frequencies. If the loop operates at a sub-sampled rate, for example, if a new $R_m$ is computed only every L samples, then the phase accumulator itself can have a gain of L (the buffer size). The phase accumulator value PA is multiplied by the clocks per input sample k, and thus, the total loop gain external to the filter in this case may be k*L. If the value of the error gain, EG, in the filter is set to 1/k*L or less, then the error gain portion of the loop is stable. The value of the integrator gain, IG, determines the damping or resonance of the loop. If IG is set to $EG^2/2$, the loop can be critically damped. The value of EG determines the filter cutoff frequency. A value close to 1/k*L provides the quickest response time to changes in the external sample rate; smaller values provide slower response times but higher rejection of jitter in the measured presentation time (which can be caused by relatively slow wall clock frequencies or jitter in the actual presentation time). A static choice of EG appropriate to given system requirements, with IG set to $EG^2/2$, may provide a solution in some embodiments.

Since both the tracking of rapid changes in external sample rate and the rejection of jitter are desirable properties, use of an adaptive filter may be desirable. According to various embodiments, such a filter may vary its cutoff frequency in response to the magnitude of the latency error. When a large latency error is detected, the filter can adapt to a high cutoff frequency, allowing it to rapidly respond to the change in sample rate that has presumably caused the latency error. When latency errors remain small, the filter gradually adapts to a very low cutoff frequency, thus achieving excellent jitter rejection in the steady state.

The adaptive filter can be programmed to have a window of acceptable latency error values. Such approach can allow the tracker to tolerate very jittery measured presentation times, such as those provided when a fixed data rate channel carries audio data at a lower sample rate. Such conditions can be found, for example, in the Serial Low-power Inter-chip Media Bus (SLIMbus) standard when using the Pushed or Pulled protocols. In such cases, the latency jitter is larger than one data rate channel period. The adaptive filter window is set slightly larger than this variation. The filter can begin with a high cutoff frequency, rapidly acquiring a good estimate of R. When this occurs, the measured latency errors fall within the window and the filter can adapt to a very low cutoff frequency. The jitter in the measured latency errors can be heavily filtered, and R may become very stable and noise free.

Figure 6:
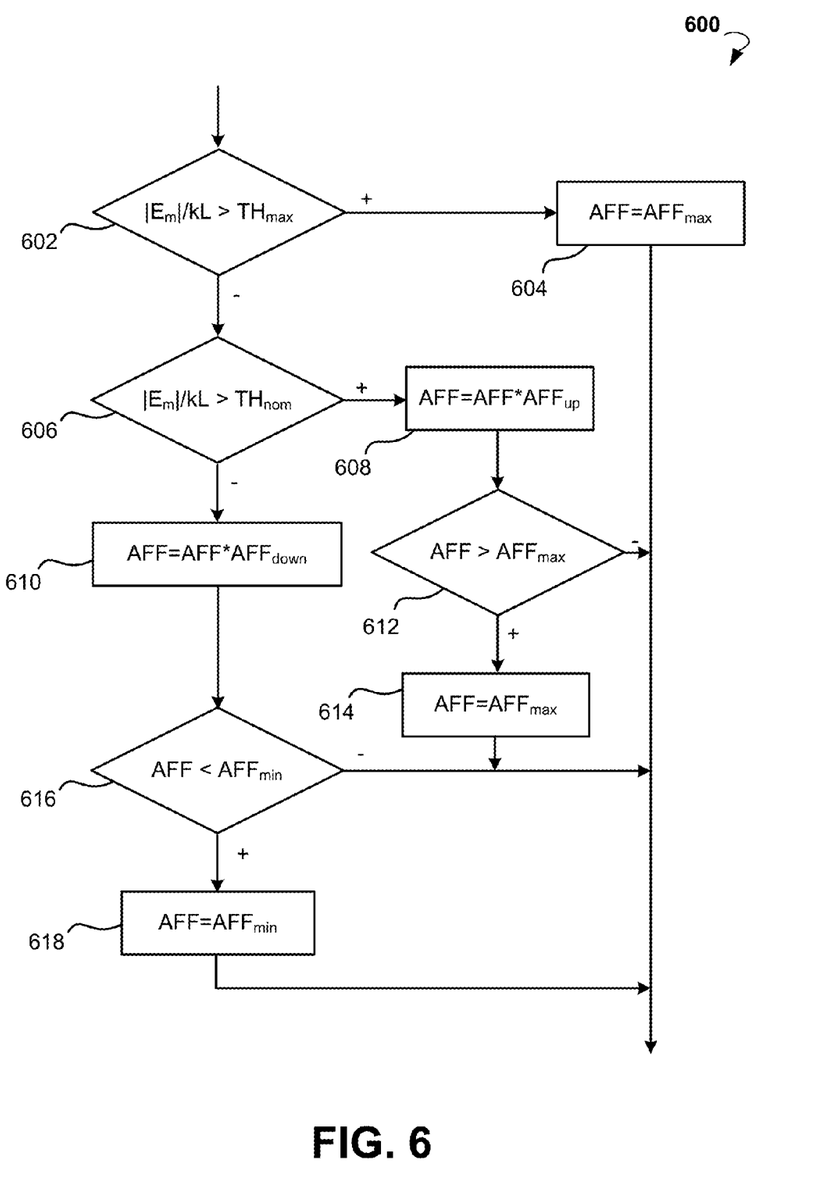
FIG. 6 is a block diagram showing an adaptive filter for filtering a latency error, according to an example embodiment.

According to various embodiments, an adaptive filter can be implemented, for example, based on the filter of FIG. 5. As shown in FIG. 6, an example adaptive filter 600 can include operational modules 602-618 operable to filter a latency error (error term $E_m$).

The error gain EG equals the adaptive filter factor, AFF, divided by k*L. The integrator gain IG is equal to AFF squared divided by 2*k*L. The parameters of the adaptive filter, in this case, the maximum filter factor $AFF_{max}$, the minimum filter factor $AFF_{min}$, maximum error threshold $TH_{max}$, nominal phase threshold $TH_{nom}$, and upward and downward step factors $AFF_{up}$ and $AFF_{down}$, can all be chosen as appropriate for the specific application. For example, one choice may include $AFF_{max}$=0.5 (chosen for rapid adaption to a step function in an external sample rate), $AFF_{min}$=0.001 (chosen for a good jitter rejection in the steady state), $TH_{max}$=1 (when a phase error of one sample period is reached, AFF may jump to its maximum), $TH_{nom}$=0.6 (as long as the phase error is less than 0.6 sample periods, the filter may increase its jitter rejection), $AFF_{up}$=1.01 and $AFF_{down}$=0.99 (the adaption steps are 1%).

By way of example and not limitation, in some embodiments the output samples can be transmitted from a buffer (the "channel buffer"), and a measurement can be made (the "channel period", or CP) of the wall clock time interval taken by the external sample rate to exhaust the samples in this channel buffer. (Note that the sum of these intervals can be exactly equal to the wall clock difference over the associated period for any number of intervals, in other words, no wall clocks can be skipped.) When the transmitter has finished transmitting the samples to the channel buffer, it can request that the buffer be filled again by issuing a channel buffer "trigger." In some embodiments, the channel buffer can be implemented as a pair of "ping-pong" buffers. The resampling algorithm may respond to a channel trigger by computing the new contents of the channel buffer from a buffer full of audio samples to be resampled and transmitted (the "frame buffer"). As initial conditions, the frame buffer starts being processed at its first sample $X_0$ to produce its first sample to be transmitted $Y_0$, which may then be the first sample in the first channel buffer.

Prior to the initialization, the system can determine a nominal sample rate conversion ratio $R_{nom}$. The nominal sample rate can be derived from the CP, for example, by a table lookup of a set of supported values of $R_{nom}$. In some embodiments (such as SLIMbus), the external hardware can supply the value of $R_{nom}$. Additionally (at approximately this time), a range of acceptable values for CP can be determined. If a value of CP is found to be outside this range, the system may be notified that the outgoing sample rate is not as specified, and the system software may take corrective action.

The initialization can be performed prior to the first ASRC execution, by setting a persistent variable, setting the channel time (CT) to zero, and setting ASRC phase accumulator (PA) to zero.

The channel buffer can now be filled from the frame buffer by the resampler, using $R_{nom}$ for $R_0$ and starting with the zeroed $PA_0$. Note that the number of frame buffer samples consumed depends on $R_{nom}$ for the first ASRC execution and on R for subsequent executions, and thus are dependent on the varying external sample rate.

At each subsequent channel buffer trigger, a new value of CP can be obtained. The value of CP is first determined to be within the acceptable range; if it is not, the system may be notified of the error. The CT can then be incremented by CP, and the result can be maintained modulo k*(size of frame buffer). PA is maintained modulo (size of frame buffer). All calculations can be performed according to these modulo operations, for example, either by appropriate use of modulo arithmetic, or by subtracting k*(size of frame buffer) from CT whenever it is subtracted from PA. Alternatively, the variables may be maintained in a format that can represent sufficiently large values that they will not overflow under practical circumstances, and the modulo operations avoided.

An error term can be computed on a sub-sampled basis. Approximately every L channel buffer period, a new error term is calculated. The value of L can be, for example, a system parameter set based on customer requirements; it may also be time varying. If the current buffer is not to be used for error term calculation, no further action needs to be taken for the sample rate tracking algorithm, and the channel buffer can be again be filled from the algorithm frame buffer using the current value of R.

At an appropriate time, the error term can be calculated as follows:

$$E = CT - PA*k$$

This error term represents the time, in wall clock periods, between the actual validity time of the current sample and the validity time expressed in the current PA as a result of the current value of R. Any error indicates that the value of R should be corrected. The channel time being larger than PA* k indicates that R should be increased, if on the other hand, the channel time is smaller than PA* k R should be decreased.

If desired, an adaptive filter process can be performed. If $E/(k*L)>TH_{max}$, then $AFF=AFF_{max}$, otherwise if $E/(k*L)>TH_{nom}$, AFF can be multiplied by $AFF_{up}$; if $E/(k*L)<=TH_{nom}$, AFF can be multiplied by $AFF_{down}$. Then AFF is limited to the range $AFF>=AFF>=AFF_{min}$. EG is set to AFF/(k*L), and IG to $AFF^2/(2*k*L)$.

A low-pass filter can comprise two coefficients, the integrating filter gain IG and the error gain EG, which can be, for example, either static and chosen for the application, or computed by the adaptive filter step. The integrating filter state variable IF may allow an infinite DC gain as desired; the error gain term determines the cutoff frequency and also ensures that the filter is stable. First, for example, a new integrating filter state variable corresponding to $E_m$ and $R_{m+1}$ can be computed as:

$$IF_m = IF_{m-1} + E_m * IG$$

Then the new sample rate conversion ratio can be computed ($R_{nom}$ is the nominal, expected value of R) as:

$$R_m = R_{nom} + IF_m + E_m * EG$$

Variable Input and Output Embodiments

In some example embodiments, $X_n$ has a time varying sample period $T_{in}(n)$, and $Y_m$ has a time varying sample period $T_{out}(m)$. $PA_m$ can be computed from $R_m$ normally and $PA_m$ can represent, for any output point $Y_m$, the time $t_m$ in units of the period of $X_n$. To derive an error equation, the measured presentation times $t_m$ and $t_n$ can be related using $PA_m$.

In some embodiments the error term can be determined based on a current measurement of $t_m$ and a previous measurement of $t_n$. An equation similar to the output error equation can be used as follows:

$$E_m = t_m - t_n + (PA_m - n) * T_{in}$$

In other words, the expected presentation time $t_m$ of an output sample $Y_m$ is the presentation time $t_n$ of a previous input sample $X_n$ plus the excess time that the phase accumulator represents between point $X_n$ and point $Y_m$, which is the value of $PA_m$ less n, measured in $X_n$ periods.

The subtlety in this equation is that $T_{in}$ may not be constant; it may be time varying. In some embodiments, it is slowly time varying, and an estimate of its current value can be obtained. This can be done by directly measuring the period of $X_n$. When choosing a value of $PA_m$ that is close to n, any error in $T_{in}$ is multiplied by a small number, and thus is of lesser significance. Furthermore, since the computation is performed within the feedback loop and its result is low-pass filtered, any remaining error is filtered to a minimal value.

Since R can be defined as the input sample rate divided by the output sample rate, R can be expressed as $T_{out}/T_{in}$. Accordingly, the above equation may be equivalently as follows:

$$E_m = t_m - t_n + (PA_m - n) * T_{out}/R$$

In some example embodiments, R may be large, and $T_{out}$ may be larger than $T_{in}$ and thus have a smaller error in its count as measured in wall clock time units. Since a division operation can be disadvantageous in implementation, the equation can be transformed to:

$$R * E_m = (t_m - t_n) * R + (PA_m - n) * T_{out}$$

Accordingly, there are similarities to the variable input case.

Some embodiments are analogous to the embodiments above. A channel period CP is measured in wall clock units for both the input and output streams ($CP_n$ and $CP_m$); these correspond to the $T_{in}$ and $T_{out}$ of the above error equations and is measured in wall clock units. These values can be used to create the corresponding channel times $CT_n$ and $CT_m$; these correspond in the error equation to $t_n$ and $t_m$ in wall clock units. Using the appropriate modulo arithmetic techniques (or alternatively, sufficiently large numeric representations), the error is calculated and filtered to provide updated estimates of R in a manner analogous to the other embodiments presented above.

Note that in embodiments of the present disclosure, $t_m$ can be greater than $t_n$ and thus $(PA_m - n)$ can be positive. But it is possible, that the reverse is true as well: $t_m$ is less than to and $(PA_m - n)$ is negative. This does not cause a problem, because the error equation remains accurate.

Further Embodiments

In addition to the variable input, variable output, and variable input and output embodiments, as presented above, there exist many other variants to which the systems and methods of the present disclosure can be applied.

Example of Transmit

By way of example and not limitation, the following pseudocode illustrates an example of transmit according to embodiments of the present disclosure.

Incoming from Tx Lightweight Process:
0<=CT<K*FBsize;
0<=intPA<FBsize;
0<=fracPA<1;
Tx Heavyweight Algorithm:
err=CT-K*intPA;
if (err>K*FBsize/2) err=err-K*FBsize; // >, >=either is OK
if (err<K*FBsize/2) err=err+K*FBsize; // <, <=either is OK
err=err-K*fracPA;
if (err>=maxThreshold) margin=maxMargin; // >, >=either is OK
else if (err>=phaseThreshold) margin=margin*factorUp; // >, >=either is OK
else margin=margin*factorDown;
if (margin>maxMargin) margin=maxMargin; // >, >=either is OK
else if (margin<minMargin) margin=minMargin; // <, <=either is OK
err=err*errGain; // errGain is pre-computed as 1/(K*FBsize)
errFilt=margin*err;
intFilt=intFilt+errFilt*margin/2;
R=Rnom+intFilt+errFilt;
// Parameters and State Variables:
vaFloat IntFilt; // State variable, initialized to zero, values within +/-0.024
vaFloat margin; // State variable, initialized to maxMargin, value minMargin to maxMargin
vaFloat K; // Parameter, depends on frame buffer sample rate, values from 384 to 9,216
vaFloat K*FBsize; // Parameter, used to calculate +/-variants and K*FBsize/2
vaFloat ErrGain; // Parameter, computed as 1/(K*CBsize)
vaFloat Rnom; // Parameter, nominal sample rate ratio, values 1/24 to 24
vaFloat minMargin; // Parameter, lowest value of margin, values 0.0001 to 1
vaFloat maxMargin; // Parameter, highest value of margin, values 0.1 to 1
vaFloat factorUp; // Parameter, factor by which margin increases, values 1 to 2
vaFloat factorDown; // Parameter, factor by which margin decreases, values 0.5 to 1
vaFloat maxThreshold; // Parameter, K*(phase to force margin to max), values 0.1 to 16
vaFloat phaseThreshold; // Parameter, K*(phase below which margin decreases), values 0.001 to 12
// Total Math: Mpys: 6, Adds: 7, Compares: 6

Example of Receive

By way of further example and not limitation, the following pseudocode illustrates an example of receive according to some embodiments of the present disclosure.

Incoming from Rx Lightweight Process:
0<=CT<K*FBsize;
0<=intPA<CBsize;
0<=fracPA<1;
Heavyweight Algorithm:
err=CT*R+K*intPA;
while (err>R*K*FBsize/2) err=err-R*K*FBsize; // This loop occurs no more than twice
err=err+K*fracPA;
if (err>=maxThreshold) margin=maxMargin;
else if (err>=phaseThreshold) margin=margin*factorUp;
else margin=margin*factorDown;
if (margin>maxMargin) margin=maxMargin;
else if (margin<minMargin) margin=minMargin;

err=err*errGain; // errGain is actually 1/(K*FBsize)
errFilt=margin*err;
intFilt=intFilt+errFilt*margin/2;
R=Rnom+intFilt+errFilt;
// Parameters and State Variables:
vaFloat IntFilt; // State variable, initialized to zero, values within +/−0.024
vaFloat margin; // State variable, initialized to maxMargin, value minMargin to maxMargin
vaFloat R; // State variable, initialized to Rnom, values from 1/24 to 24
vaFloat K; // Parameter, depends on frame buffer sample rate, values from 384 to 9,216
vaFloat K*FBsize; // Parameter, used to calculate /2 variants
vaFloat ErrGain; // Parameter, computed as 1/(K*FBsize)
vaFloat Rnom; // Parameter, nominal sample rate ratio, values 1/24 to 24
vaFloat minMargin; // Parameter, lowest value of margin, values 0.0001 to 1
vaFloat maxMargin; // Parameter, highest value of margin, values 0.1 to 1
vaFloat factorUp; // Parameter, factor by which margin increases, values 1 to 2
vaFloat factorDown; // Parameter, factor by which margin decreases, values 0.5 to 1
vaFloat maxThreshold; // Parameter, K*(phase to force margin to max), values 0.1 to 16
vaFloat phaseThreshold; // Parameter, K*(phase below which margin decreases), values 0.001 to 12
// Total Math: Mpys: 7, Adds: 7, Compares: 6

Example of Combination

By way of example and not limitation, the above pseudo code examples can be combined. An important consideration can be an appropriate selection of parameters for the Tx (output variable) or Rx (input variable) cases.
// State Variables:
vaFloat Rout;// Tx: not used for state Rx: R, init to Rnom
vaFloat intFilt; // Tx: integrator of filter, init to 0 Rx: integrator of filter, init to 0
vaFloat margin; // Tx: margin, init to maxMargin Rx: margin, init to maxMargin // Parameters:
*vaFloat Rptr; // Tx: Points to literal 1.0 Rx: Points to Rout
vaFloat Kval;// Tx: −K Rx: K
vaFloat modBase; // Tx: K*FBsize Rx: K*FBsize
vaFloat ErrGain; // Tx: 1/(K*CBsize) Rx: −1/(K*FBsize*Rnom)
vaFloat Rnom; // Tx: Nominal value of R Rx: Nominal value of R
vaFloat maxMargin; // Tx: maximum value of margin Rx: maximum value of margin
vaFloat minMargin; // Tx: minimum value of margin Rx: minimum value of margin
vaFloat maxThrshld; // Tx: K*(phase for margin to max) Rx: Rnom*K*(phase for margin to max)
vaFloat phaseThrshld; // Tx: K*(phase for margin decrease) Rx: Rnom*K*(phase for margin decreas)
vaFloat factorUp; // Tx: factor for margin increase Rx: factor for margin increase
vaFloat factorDown; // Tx: factor for margin decrease Rx: factor for margin decrease
// Heavyweight Common Task: Inputs are CT, IntPA, fracPA. Temporary variables in BoldItalic
R=*Rptr;
err=CT*R+Kval*intPA;
modulus=R*modBase while (err>modulus/2) err=err−modulus;
while (err<modulus/2) err=err+modulus;
err=err+Kval*fracPA;
if (err>=maxThreshold) margin=maxMargin;
else if (err>=phaseThreshold) margin=margin*factorUp;
else margin=margin*factorDown;
if (margin>maxMargin) margin=maxMargin;
else if (margin<minMargin) margin=minMargin;
err=err*errGain;
err=margin*err;
intFilt=intFilt+err*margin/2;
Rout=Rnom+intFilt+err;
// Total Math: Mpys: 8, Adds: 8, Compares: 7

Figure 7:
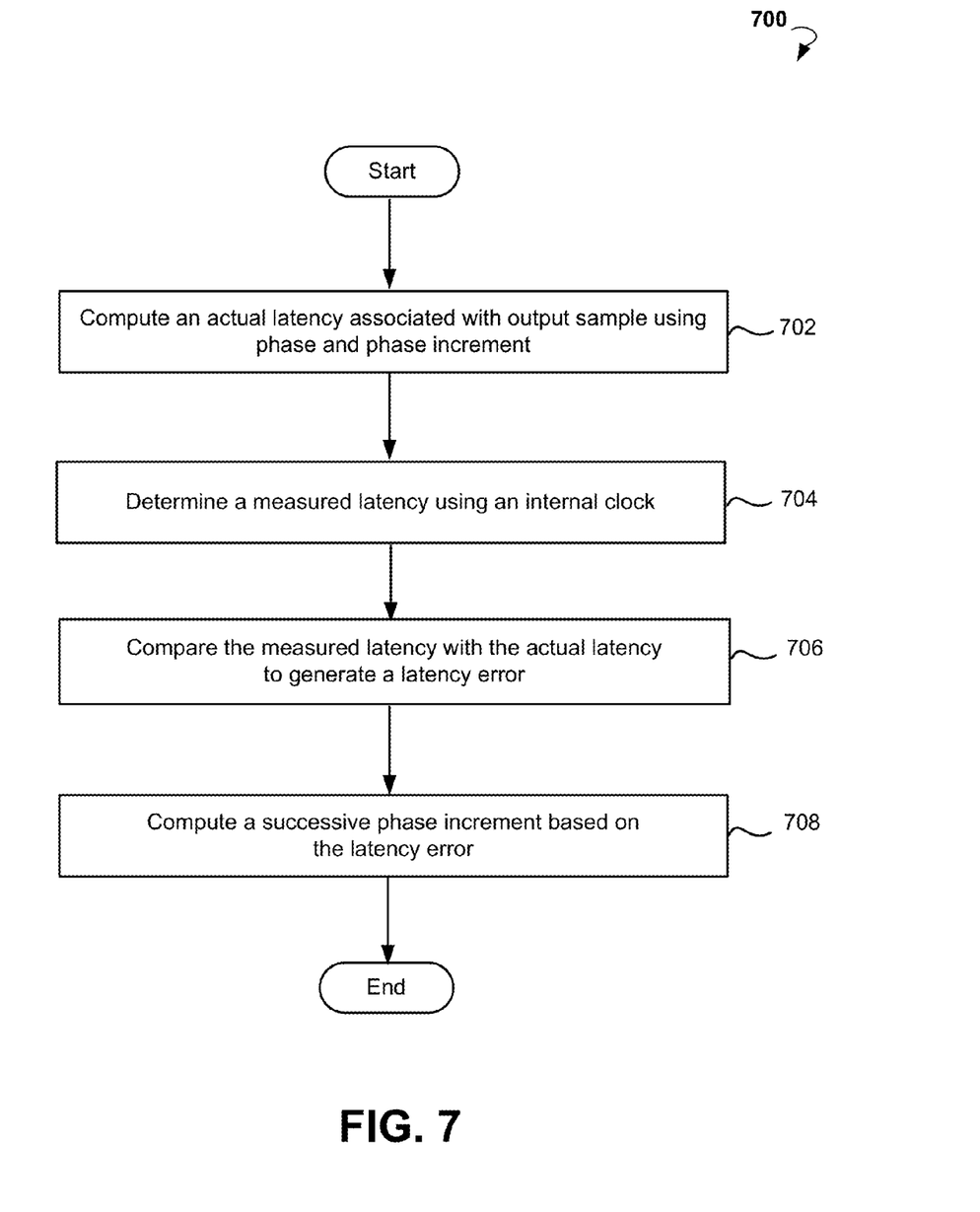
FIG. 7 is a flow chart illustrating a method for sample rate tracking, according to an example embodiment.

FIG. 7 is a flow chart illustrating steps of an example method for sample rate tracking. The method 700 may commence with computing an actual latency associated with an output sample from an output sample stream in step 702. The actual latency can be computed using a phase (phase accumulator) and a phase increment (conversion sample rate ratio). In step 704, the method 700 can continue with determining a measured latency using an internal clock. In step 706, the measured latency can be compared with the actual latency to generate a latency error. In step 708, the method 700 can further proceed with computing a successive phase increment based on the latency error.

Figure 8:
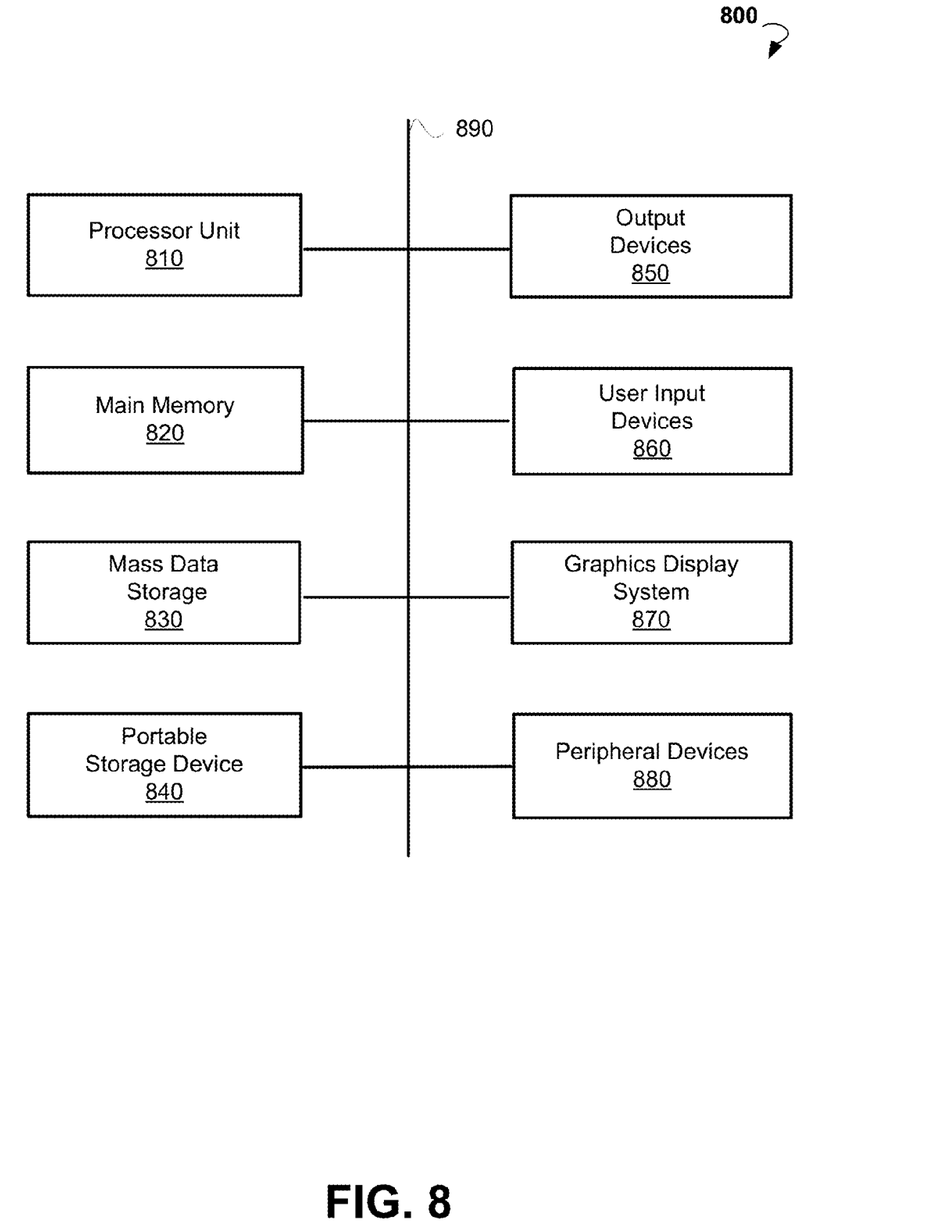
FIG. 8 is an example of a computing system implementing method for sample rate tracking.

FIG. 8 illustrates an example computer system 800 that may be used to implement embodiments of the present disclosure. The computer system 800 of FIG. 8 can be implemented in the contexts of the likes of computing systems, networks, servers, or combinations thereof. The computer system 800 of FIG. 8 includes one or more processor units 810 and main memory 820. Main memory 820 stores, in part, instructions and data for execution by processor unit 810. Main memory 820 stores the executable code when in operation. The computer system 800 of FIG. 8 further includes a mass data storage 830, portable storage device(s) 840, output devices 850, user input devices 860, a graphics display system 870, and peripheral devices 880. The methods may be implemented in software that is cloud-based.

The components shown in FIG. 8 are depicted as being connected via a single bus 890. The components may be connected through one or more data transport means. Processor unit 810 and main memory 820 is connected via a local microprocessor bus, and the mass data storage 830, peripheral device(s) 880, portable storage device 840, and graphics display system 870 are connected via one or more input/output (I/O) buses.

Mass data storage 830, which can be implemented with a magnetic disk drive, solid state drive, or an optical disk drive, is a non-volatile storage device for storing data and instructions for use by processor unit 810. Mass data storage 830 stores the system software for implementing embodiments of the present disclosure for purposes of loading that software into main memory 820.

Portable storage device 840 operates in conjunction with a portable non-volatile storage medium, such as a floppy disk, Compact Disk, digital video disc, or Universal Serial Bus (USB) storage device, to input and output data and code to and from the computer system 800 of FIG. 8. The system software for implementing embodiments of the present disclosure is stored on such a portable medium and input to the computer system 800 via the portable storage device 840.

User input devices 860 provide a portion of a user interface. User input devices 860 include one or more microphones, an alphanumeric keypad, such as a keyboard, for inputting alphanumeric and other information, or a pointing device, such as a mouse, a trackball, stylus, or cursor direction keys.

User input devices 860 can also include a touchscreen. Additionally, the computer system 800 as shown in FIG. 8 includes output devices 850. Suitable output devices include speakers, printers, network interfaces, and monitors.

Graphics display system 870 include a liquid crystal display (LCD) or other suitable display device. Graphics display system 870 receives textual and graphical information and processes the information for output to the display device.

Peripheral devices 880 may include any type of computer support device to add additional functionality to the computer system.

The components provided in the computer system 800 of FIG. 8 are those typically found in computer systems that may be suitable for use with embodiments of the present disclosure and are intended to represent a broad category of such computer components that are well known in the art. Thus, the computer system 800 of FIG. 8 can be a personal computer (PC), hand held computing system, telephone, mobile computing system, workstation, tablet, phablet, mobile phone, server, minicomputer, mainframe computer, wearable, or any other computing system. The computer may also include different bus configurations, networked platforms, multi-processor platforms, and the like. Various operating systems may be used including UNIX, LINUX, WINDOWS, MAC OS, PALM OS, ANDROID, IOS, QNX, and other suitable operating systems.

It is noteworthy that any hardware platform suitable for performing the processing described herein is suitable for use with the embodiments provided herein. Computer-readable storage media refer to any medium or media that participate in providing instructions to a central processing unit (CPU), a processor, a microcontroller, or the like. Such media may take forms including, but not limited to, non-volatile and volatile media such as optical or magnetic disks and dynamic memory, respectively. Common forms of computer-readable storage media include a floppy disk, a flexible disk, a hard disk, magnetic tape, any other magnetic storage medium, a Compact Disk Read Only Memory (CD-ROM) disk, digital video disk (DVD), BLU-RAY DISC (BD), any other optical storage medium, Random-Access Memory (RAM), Programmable Read-Only Memory (PROM), Erasable Programmable Read-Only Memory (EPROM), Electronically Erasable Programmable Read Only Memory (EEPROM), flash memory, and/or any other memory chip, module, or cartridge.

In some embodiments, the computer system 800 may be implemented as a cloud-based computing environment, such as a virtual machine operating within a computing cloud. In other embodiments, the computer system 800 may itself include a cloud-based computing environment, where the functionalities of the computer system 800 are executed in a distributed fashion. Thus, the computer system 800, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources.

The cloud may be formed, for example, by a network of web servers that comprise a plurality of computing devices, such as the computer system 800, with each server (or at least a plurality thereof) providing processor and/or storage resources. These servers may manage workloads provided by multiple users (e.g., cloud resource customers or other users). Typically, each user places workload demands upon the cloud that vary in real-time, sometimes dramatically. The nature and extent of these variations typically depends on the type of business associated with the user.

While the present embodiments have been described in connection with a series of embodiments, these descriptions are not intended to limit the scope of the subject matter to the particular forms set forth herein. It will be further understood that the methods are not necessarily limited to the discrete components described. To the contrary, the present descriptions are intended to cover such alternatives, modifications, and equivalents as may be included within the spirit and scope of the subject matter as disclosed herein and defined by the appended claims and otherwise appreciated by one of ordinary skill in the art.

What is claimed is:

1. A method for asynchronous sample rate tracking, the method comprising:
   computing an actual latency associated with an output sample selected from an output sample stream using a phase and a phase increment, the phase increment comprising a sample rate ratio;
   determining a measured latency using an internal clock; and
   comparing the measured latency to the actual latency to generate a latency error.

2. The method of claim 1, wherein the measured latency is determined based on a presentation time of an input sample selected from an input sample stream.

3. The method of claim 1, wherein the measured latency is determined based on a presentation time of the output sample stream.

4. The method of claim 1, further comprising computing a successive phase increment based on the latency error.

5. The method of claim 4, wherein computing the successive phase increment incudes filtering the latency error with a low-pass filter.

6. The method of claim 4, wherein computing the successive phase increment incudes filtering the latency error with an adaptive filter.

7. The method of claim 1, wherein the latency error is determined for each output sample from the output sample stream.

8. The method of claim 1, wherein the latency error is computed for selected output samples from the output sample stream.

9. The method of claim 1, wherein the phase is periodically reduced by a pre-determined value.

10. A system for asynchronous sample rate tracking, the system comprising at least:
    an internal clock; and
    a circuit, wherein the circuit is configured to:
       compute an actual latency associated with an output sample from an output sample stream using a phase and a phase increment, the phase increment comprising a sample rate ratio;
       determine a measured latency using the internal clock; and
       compare the measured latency to the actual latency to generate a latency error.

11. The system of claim 10, wherein the measured latency is determined based on a presentation time of an input sample from an input sample stream.

12. The system of claim 10, wherein the measured latency is determined based on a presentation time of the output sample.

13. The system of claim 10, wherein the circuit is further configured to compute a successive phase increment based on the latency error.

14. The system of claim 13, wherein while computing the successive phase increment, the latency error is filtered with a low-pass filter.

15. The system of claim 13, wherein while computing the successive phase increment, the latency error is filtered with an adaptive filter.

16. The system of claim 10, wherein the latency error is determined for each output sample from the output sample stream.

17. The system of claim 10, wherein the latency error is computed for selected output samples from the output sample stream.

18. The system of claim 10, wherein the phase is periodically reduced by a pre-determined value.

19. A non-transitory computer readable medium having embodied thereon a program, the program providing instructions for a method for sample rate tracking, the method comprising:
    computing an actual latency associated with an output sample from an output sample stream using a phase and a phase increment, the phase increment comprising a sample rate ratio;
    determining a measured latency using an internal clock; and
    comparing the measured latency to the actual latency to generate a latency error.

20. The non-transitory computer readable medium of claim 19, wherein the method for sample rate tracking further comprising computing a successive phase increment based on the latency error.

* * * * *